(12) United States Patent
Kastalsky

(10) Patent No.: US 7,728,333 B2
(45) Date of Patent: Jun. 1, 2010

(54) NANOTUBE ARRAY BALLISTIC LIGHT EMITTING DEVICES

(75) Inventor: Alexander Kastalsky, Wayside, NJ (US)

(73) Assignee: Nano-Electronic and Photonic Devices and Circuits, LLC, Bridgeport, PA (US)

( * ) Notice: Subject to any disclaimer, the term of this patent is extended or adjusted under 35 U.S.C. 154(b) by 469 days.

(21) Appl. No.: 11/716,063

(22) Filed: Mar. 9, 2007

(65) Prior Publication Data

US 2008/0218074 A1   Sep. 11, 2008

(51) Int. Cl.
  *H01L 27/14*   (2006.01)
(52) U.S. Cl. .................. 257/72; 977/700; 977/932; 372/50.12; 313/509
(58) Field of Classification Search ............ 372/50.121, 372/50.124; 257/10, 9, 62; 977/700; 343/911 R
  See application file for complete search history.

(56) References Cited

U.S. PATENT DOCUMENTS

| | | | |
|---|---|---|---|
| 4,503,447 A * | 3/1985 | Iafrate et al. ............... 257/15 |
| 5,684,817 A * | 11/1997 | Houdre et al. ........... 372/45.01 |
| 5,955,749 A * | 9/1999 | Joannopoulos et al. ........ 257/98 |
| 6,958,494 B2 * | 10/2005 | Lin et al. ................ 257/86 |
| 6,998,634 B2 | 2/2006 | Cheong et al. |
| 7,102,157 B2 | 9/2006 | Kastalsky |
| 7,194,174 B2 * | 3/2007 | Dridi et al. ............... 385/129 |
| 7,348,675 B2 | 3/2008 | Dubin et al. |
| 7,470,620 B2 | 12/2008 | Dubin et al. |
| 2002/0097770 A1 | 7/2002 | Mekis et al. |
| 2002/0172820 A1 | 11/2002 | Majumdar et al. |
| 2004/0044235 A1 | 3/2004 | Cheron et al. |
| 2004/0058153 A1 | 3/2004 | Ren et al. |
| 2005/0161662 A1 | 7/2005 | Majumdar et al. |
| 2005/0230270 A1 | 10/2005 | Ren et al. |
| 2006/0169972 A1 | 8/2006 | Furukawa et al. |
| 2006/0220141 A1 | 10/2006 | Besser |
| 2006/0228074 A1 | 10/2006 | Lipson et al. |
| 2007/0032051 A1 | 2/2007 | Lieber et al. |
| 2007/0114628 A1 | 5/2007 | Barrios et al. |
| 2007/0164270 A1 | 7/2007 | Majumdar et al. |

* cited by examiner

*Primary Examiner*—Minsun Harvey
*Assistant Examiner*—Tuan N. Nguyen
(74) *Attorney, Agent, or Firm*—Woodcock Washburn, LLP

(57) ABSTRACT

A new class of light emitting and laser diodes is disclosed wherein ballistic (without collisions) electron propagation along the nanotubes, grown normally to the substrate plane on the common metal electrode, provides conditions for the light emission from the nanotubes. The electrons, tunneling from the input contact into high energy states in the nanotubes, emit light via electron energy relaxation between the quantum energy levels existing in the nanotubes due to quantum size effect.

In the disclosed devices, planar layer deposition technology is used to form a diode structure with two electrodes attached to the nanotubes ends.

10 Claims, 5 Drawing Sheets

NANOTUBE ARRAY BALLISTIC LIGHT EMITTING DEVICES

FIELD OF THE INVENTION

The invention relates to carbon nanotube-based ballistic opto-electronic devices, in particular, light emitting diodes and lasers employing array of grown nanotubes.

BACKGROUND OF THE INVENTION

The carbon nanotubes (CNT) possess unique properties due to extremely small nanotube diameter (~1 nm for a single walled nanotube, SWNT) which gives rise to a strong two-dimensional quantization of the energy spectrum. As a result, the electron scattering is largely suppressed and the electrons move along the nanotube ballistically, i.e. without collisions and loss of energy, while the nanotube resistance is essentially controlled by the contact resistances. The minimum contact resistance is determined by the quantum contact resistance of 6.5 kOhm (per contact).

In the previous patent U.S. Pat. No. 7,102,157, the ballistic electron propagation along the nanotube was utilized to disclose a vacuum electron emitter, in which electrons under the potential difference between the contacts V approaching the $\phi/e$, where $\phi$ is the nanotube work function (~4.7 eV for CNT), will be able to escape into vacuum and be collected with an external electrode (anode).

It should be emphasized that the physical meaning of the ballistic transport is more stringent than simple preservation of the electron energy, which is needed for the discussed below invented devices, according to the present invention. It requires a phase coherent resonance for electron propagation, like Fabry-Perot resonance for the light propagation in the laser, see e.g. W. Liang et al, Nature, 411, 665, 2001; or J. Kong et al, Phys. Rev. Lett. 87, 106801, 2001. In the disclosed devices, the elastic electron scattering, such as impurity scattering affecting the electron phase, is not important factor since it does not change the electron energy. In the description below, the "ballistic" electron transport implies only the energy conservation during the electron movement within the nanotube.

FIG. 1 illustrates as a Prior Art the ballistic mechanism of electron escape into vacuum discussed in the above cited patent. A CNT is placed between two contacts, which form the emitter circuit. FIG. 1a shows the energy band diagram. The contacts are shown as potential barriers in conjunction with electron reservoirs of the metal electrodes, while the CNT is shown as a low electron density semiconductor 90. When voltage V is applied between the contacts, see FIG. 1b, the voltage is distributed across the input and output contacts as $V_{in}$ and $V_{out}$ respectively, according to the tunneling resistance of the barriers. The electrons tunnel through the input barrier into the nanotube and move ballistically (i.e. without energy loss) through high energy states to the positively biased contact. This implies that electrons gain the energy $eV_{in}$. It is preferable to make the tunneling resistance of the input contact much higher than that of the output contact, i.e. $V_{in}/V_{out} \gg 1$. Then almost entire applied voltage V will drop across the input contact, $V \sim V_{in}$. If the energy $eV_{in}$ exceeds the work function $\phi$ for the nanotube, the electrons at this contact are ready to escape into vacuum and can be extracted with the anode voltage $Va > V_{in}$. In the cited patent, it was assumed that for high energy electrons there is a large probability of electron energy relaxation due to electron-phonon and electron-electron interactions, so that only a fraction of electron will be able to escape into vacuum. Strongly quantized energy spectrum of the nanotubes due to extremely small nanotube diameter dramatically suppresses the electron-phonon interaction thereby making ballistic electron propagation possible. At present, there is a lot of evidence for the ballistic electron movement in the SWNT, both at low voltages (see e.g. W. Liang, et al, Nature 411, 665, 2001 for metallic nanotubes and A. Javey et al, Nature, 424, 654, 2003 for semiconducting SWNT) and at higher voltages, see e.g. Z. Yao et al, Phys. Rev. Lett. 84, 2941, 2000. In the latter article, the mean free path of the high energy electrons for the backscattering optical phonon emission in SWNT, $l_0$, was estimated to be rather large reaching ~100 nm. This implies that for the nanotube of a length close to $l_0$ there is a large probability for the electron escape into vacuum.

In the cited above publication by A. Javey et al, a ballistic field-effect transistor was described, wherein the ballistic electron propagation between source and drain contacts on the CWNT was modulated by the gate electrode. The contacts to the nanotube were made from palladium (Pd) which minimizes the contact resistance to its quantum limit of 6.5 KOhm. Other metals form a Schottky barrier with the nanotube, with the tunneling resistance varying in a large range, typically from 10 KOhm to 1 MOhm.

In the cited above U.S. Pat. No. 7,102,157, the ballistic device is made as a single nanotube placed on the insulating substrate and endowed with two contacts at the nanotube ends, see FIG. 1c. In this configuration, parallel placement of multiple identical nanotubes to enhance the output current requires a special manipulator and seems impractical for the device manufacturing. It would be therefore preferable to grow a controllable nanotube array on a metal electrode normally to the electrode plane and then attach a second common contact to all the nanotube tips.

Such a design was partially disclosed by Z. F. Ren et al. in the US patent application # US 20040058153 A1 for fabrication of the field-emission cathode. In this design, the grown nanotubes were covered with an insulating layer, and nanotube ends protrude above this layer. Then the top side is polished to cut off the nanotube ends thus exposing the tips of the nanotubes. The nanotube array in the Ren's patent application was used solely to produce a diode-like cathode-to-anode structure for the field-induced electron emission from the nanotube into vacuum due to electric field focusing at the nanotube tips. Neither second contact to the nanotube tip nor ballistic electron movement along the nanotubes or light emission from the nanotubes are discussed there.

BRIEF DESCRIPTION OF THE INVENTION

The electron high energy injection into the nanotube and ballistic propagation along the nanotube can have an important application, related to the possibility of generating light from the nanotubes when electrons injected into high energy levels relax through the optically active quantum states and lose their energy by emitting the photons. FIG. 2 shows as a Prior Art the energy diagram of the density-of-state for metallic (a) and semiconducting (b) SWNT, see S. Kazoui et al, Synth. Met. 115, p. 283, 2000. In both cases, sharp peeks of the density-of-state indicate quantum levels, so that the high energy electrons injected into the nanotube and moving ballistically along the nanotube can relax between quantum states through the emission of light. Two embodiments of Light Emitting and Laser Diodes based on the high energy electron injection into the nanotubes with subsequent ballistic electron propagation along the nanotube are disclosed below.

The light emission from the nanotubes has been recently observed, see R. C. Johnson, EE Times, Issue 1398, p. 1, 2005. The nanotube was used as a channel of the field-effect transistor, and the light was generated by the gate voltage producing the injection of both electrons and holes into the nanotube. This method is different from the disclosed below ballistic mechanism of the unipolar (electron only) injection which leads to the light emission through the optical transitions between the quantum levels.

To build a nanotube array ballistic photonic devices according to the present invention, one has to provide two contacts to each nanotube in the array. Unlike the designs for the transistors described in the above cited U.S. Pat. No. 7,102,157, the photonic devices need only two contacts, and no electron emission into vacuum is considered. The first contact is made as a metal electrode deposited on an insulating substrate, like a glass. It is followed by deposition on the metal electrode of small pads of a catalytic metal, such as Ni, Co or Fe, to facilitate growth of the nanotube array. The growth of single walled nanotubes is preferable, since they have the strongest quantum size effect and therefore maximum energy separation between the quantum levels. Such nanotubes are best suited for the one-dimensional ballistic electron movement, since strong quantization suppresses the electron energy relaxation.

After the nanotube growth, a dielectric layer, such as $SiO_2$, is deposited on the substrate. The dielectric thickness must be slightly smaller than the nanotube length, so that the nanotube ends protrude above the dielectric film. To remove these ends, the substrate is polished, thereby creating exposed tips of the nanotubes on a flat platform, ready for further device processing.

In the below disclosed designs, according to the present invention, a second, optically transparent, conducting electrode is placed on the insulator layer covering the nanotube array and is connected to the nanotube tips, thereby forming a diode wherein all the nanotube tips in the array covered by the top contact equally participate in the light generation. Below, different embodiments of the Ballistic Light Emitting Diode (BLED) and Ballistic Lasers Diode (BLD) are disclosed.

DETAILED DESCRIPTION OF THE INVENTION

1. The BLED

Figure 3:
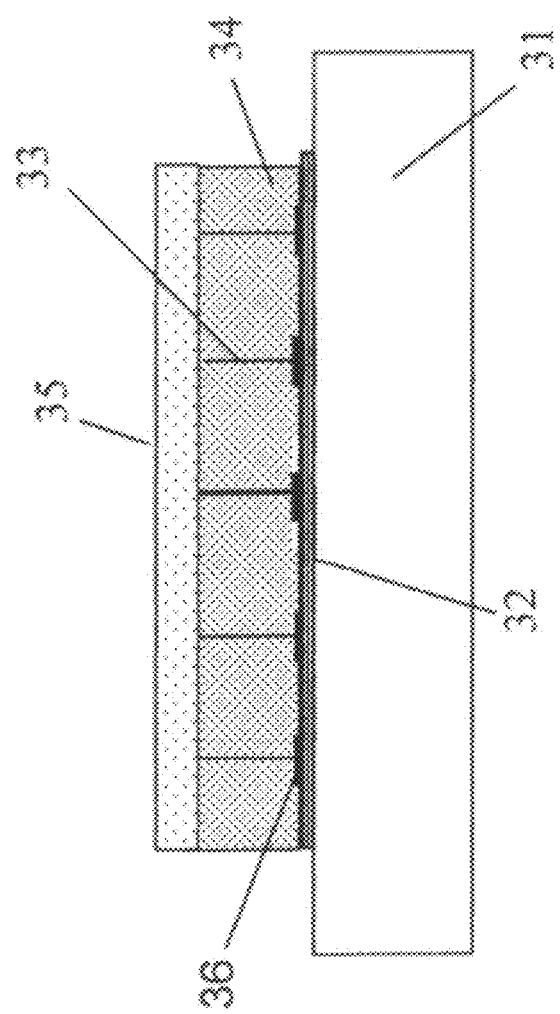
FIG. 3 shows the side view of the BLED.

FIG. 3 shows the cross-sectional view of the BLED structure. The device is made on the insulating substrate (glass) 31. The first metal layer 32 deposited on the substrate serves as a cathode electrode, on which the nanotube array will be grown. The layer 32 will also be used as a mirror to reflect light into upper hemisphere and hence should possess a high optical reflectivity, like Al. Furthermore, since the metal 32 is designed to be the output contact in the BLED, it is preferable to deposit pads of the Pd layer 36, see e.g. A. Javey et al, Nature, 424, 654, 2003, on the metal layer 32 to minimize the contact resistance. Before the nanotube growth, small pads of catalytic material (not shown), such as Ni, Fe or Co, are deposited on the Pd pads to activate the process of growth of the nanotube array 33. It is followed by depositing of an insulator 34, such as $SiO_2$ or SiOx, having the thickness smaller than the nanotube height, and then polishing the top surface to cut off the nanotubes ends and thus to both expose the nanotube tips and provide a flat platform for further processing.

The next step is unique and relates to formation of the second common contact to the nanotubes 33. The important feature of the expected light radiation is its polarization. Due to cylindrical geometry of the nanotube and energy quantization normally to the nanotube axis, one can expect a circular polarization of the electrical wave vector and light propagation along the nanotubes, i.e. normally to the substrate plane. This implies that the top contact 35 must be transparent for the light radiation, while the bottom metal contact 32 reflects the light into upper hemisphere, thereby doubling the light output intensity. The transparent electrode 35 can be made using the well known material Indium-Tin Oxide (ITO), widely used in the flat panel display industry.

As discussed above, it is preferable to have different tunneling transparency for the contacts to the nanotube. If for example, both contacts are made of Pd metal and provide the minimum, quantum, contact resistance R of ~13 KOhm, then at voltage V~10V, equally dropping across the two contacts, the current I along the nanotube I=V/R~0.8 mA is too high to be sustained by the nanotube. To minimize the current it is therefore preferable to make the resistance Ri of the electron injection contact 35 much higher then that of the resistance Ro at the output contact 32, i.e. Ri>>Ro.

It is important to keep the nanotube length close to the ballistic mean free path $l_0$. As pointed out earlier, the nanotube length of 100 nm would be comparable with the electron ballistic mean free path. The disclosed planar layer deposition technology allows fabrication of the arrays with any predetermined nanotube length.

Figure 4:
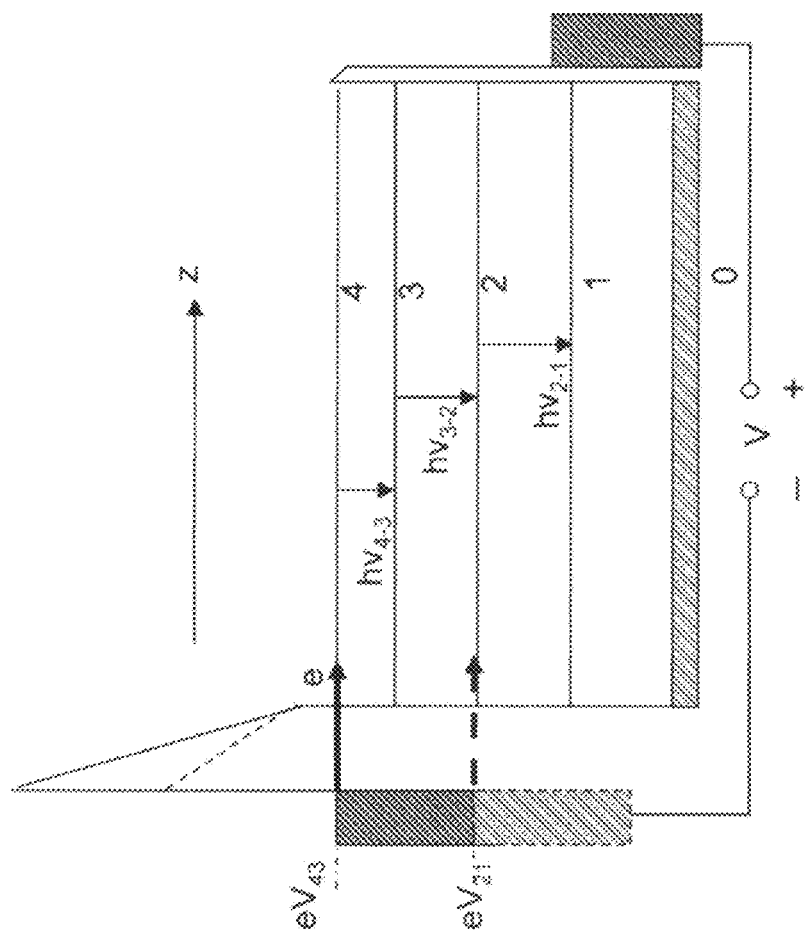
FIG. 4 shows the energy band diagram for the BLED for two different diode voltages.

FIG. 4 shows the energy band diagram for the BLED. The output (bottom) contact 32 in FIG. 3 is made from Pd metal and has the lowest, quantum, resistance Ro=6.5 KOhm, which is indicated in FIG. 4 by a thin tunneling barrier at the electron emission end. The injection resistance Ri is chosen to be much higher, Ri>>Ro, which is indicated by a thicker tunneling barrier at the electron injection contact 35 of FIG. 3. If Ri is in the range of Ri~1 MOhm, then the applied voltage V drops predominantly across this contact, and the nanotube current I=V/Ri~5 μm would be sustainable by short nanotubes, see A. Javey et al Nature, 424, 654, 2003. If however the ITO does not provide the requisite high tunneling resistance of the input contact, the contact resistance can be further increased by deposition of a thin film of transparent dielectric, like $SiO_2$, prior to ITO deposition (not shown in FIG. 3 and FIG. 4).

Figure 1:
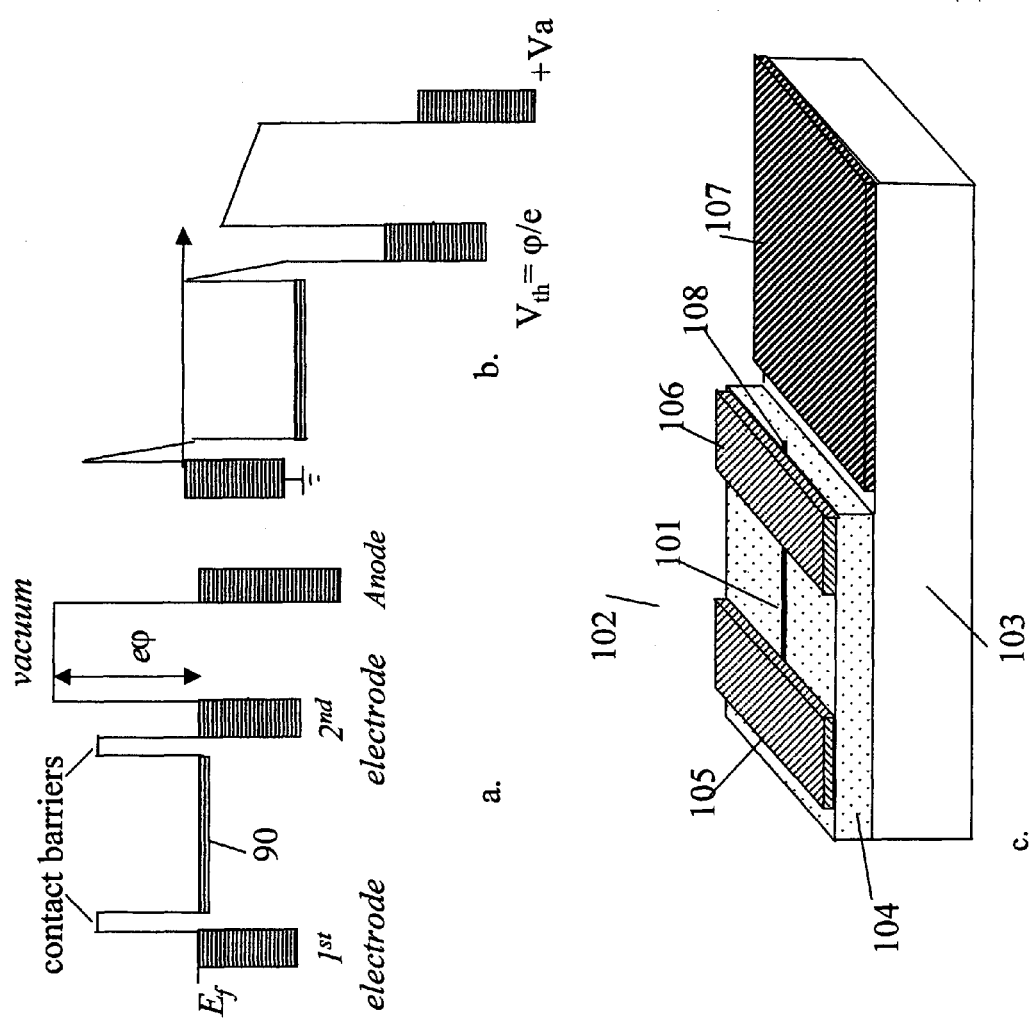
FIG. 1 illustrates a prior art ballistic mechanism of electron escape into vacuum: (a) energy band diagram; (b) voltage applied between contacts; (c) prior art ballistic device - a single nanotube placed on an insulating substrate with two contacts at the nanotube ends.
Figure 2:
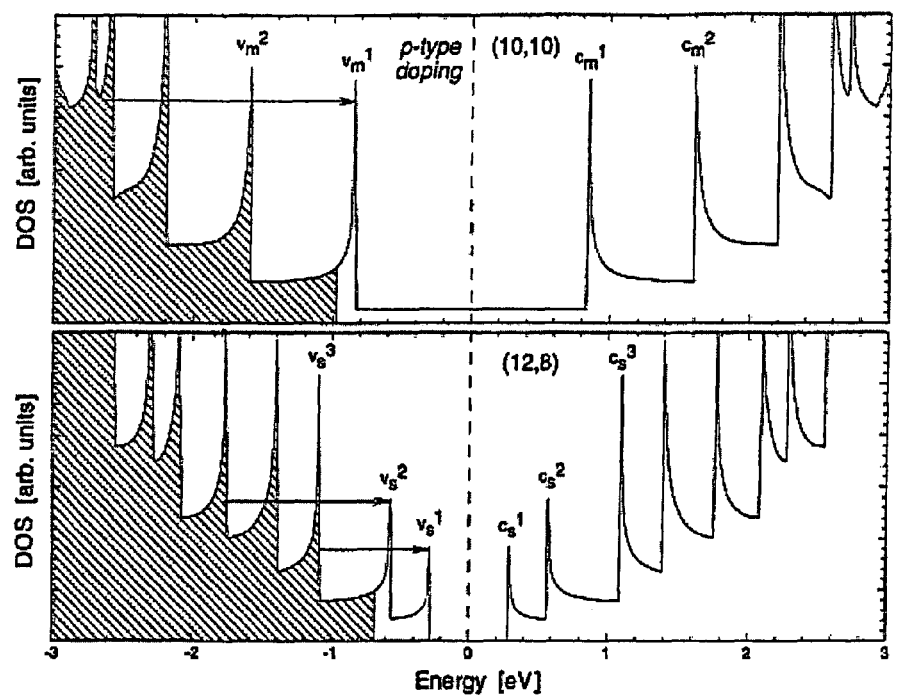
FIG. 2 shows a prior art energy diagram of the density-of-state for (a) metallic and (b) semiconducting SWNT.

It is worth emphasizing that, unlike conventional semiconductor heterostructure barriers and quantum wells where electrons tunnel in the direction of energy quantization, i.e. normally to the barrier/quantum well plane, in the disclosed devices the energy is quantized in the directions normal to the nanotube axis, while the electrons tunnel and travel along the nanotube in the third, non-quantized, z-direction, see FIG. 4. This implies that the quantum levels in the nanotube, shown in FIG. 2, although being responsible for the light emission, do not produce resonant conditions for tunneling into the nanotube along z-direction. Only the density of states in the direction z of the nanotube axis contributes to the resonance:

it has a maximum at the quantum level and then decays with the electron energy E as $\sim 1/E^{1/2}$, see e.g. High-speed semiconductor devices, J. Wiley & Sons, p. 98, 1990.

This implies that at any particular quantum level, its density of states exhibits a peak, while the density of states extending to this level from energetically lower quantum levels will be significantly reduced. In addition, the electrons at the Fermi level $E_f$ have the highest tunneling probability, since for the electrons below the Fermi level the barrier height is higher and hence, tunneling probability is lower. Both these features provide resonant conditions for electron tunneling from the Fermi level into a chosen quantum level: electrons will tunnel within a narrow energy range predominantly into this level. Such resonant conditions are illustrated in FIG. 4. where optical transitions between the quantum energy levels are indicated. The ground state (0) level in the nanotube contains electrons, and there is no voltage drops across the nanotube. The applied voltage $V_{43}$ (minus on the injecting contact) provides resonance tunneling of electrons from the Fermi level of the input contact into fourth excited state of the energy spectrum. The injected electrons can relax by emitting photons $h\nu_{4-3}$, $h\nu_{3-2}$ and $h\nu_{2-1}$, while the ground state is occupied with electrons. As discussed above, at voltage $V_{43}$, tunneling into the lower levels 3, 2 and 1 is much less probable since the barrier height for electron tunneling into these states is larger than that for the level 4. At the applied voltage $V_{21}$, also shown in FIG. 4 with a dashed line, the resonance tunneling occurs into the second quantum level, with a subsequent emission of the photon $h\nu_{2-1}$. It is worth pointing, that the disclosed light emission mechanism is based on the unipolar (electron only) injection and does not require presence of holes for recombination.

The resonant electron injection is followed by ballistic electron movement along the nanotube. The distance within the nanotube where this movement persists determines the active nanotube length for light emission. The rest of the nanotube represents the area where the electrons are essentially thermalized and do not emit light. It is therefore beneficial to have the nanotube length close to the ballistic mean free path $l_0$.

The disclosed BLEDs are expected to possess several important advantages over the semiconductor LEDs, particularly, in the low photon energy range, where the conventional LEDs utilize small energy gap materials. The LEDs based on these materials exhibit a rapid degradation of the emission threshold as temperature increases.

This effect is related to the rise with temperature of the process of carrier escape from the quantum wells, as well as enhancement of the non-radiative, Auger, recombination, see e.g. R. H. Saul et al, in Semiconductors and Semimetals, V22, Part C, p. 193, 1985. In the disclosed BLEDs, with electron only energy relaxation between quantum levels, the carrier escape does not take place, while the Auger process is suppressed by the quantization of the energy spectrum, and therefore, temperature dependence is expected to be minimal.

Another important feature of the BLED is absence of the effect of the internal reflection: since in the BLED the dimensions of the nanotube as a light source are significantly smaller than the length of the emitted light wave, the effect of internal light reflections preventing photon escape from the emissive body is absent, in contrast with the conventional LED where due to effect of internal reflections the fraction of emitted light does not exceed $\sim 5\%$, and special measures must be taken to minimize this effect. As shown in FIG. 3, the light reflection from the bottom electrode and presence of the optically transparent top electrode, allow practically full collection of light.

Extremely small dimensions of the radiation area in the BLED can be used for efficient coupling to a fiber. The ratio of the fiber diameter to the nanotube matrix dimensions in this case can be as high as several orders of magnitude, which implies the fiber coupling efficiency close to one, while in the LED the coupling efficiency is typically around $\sim 3\%$. Even one nanotube can be used as a light emitter, with the diameter of active area as small $\sim 7^{-7}$ cm$^{-2}$.

As follows from FIG. 4, several resonant wavelengths, $V_{4-3}$, $V_{3-2}$ and $V_{2-1}$ or any other combinations corresponding transitions between these levels, can be emitted at the same applied input voltage V. As the voltage decreases, the number of different wavelengths is reduced until at $V=V_{21}$ the last resonance, corresponding to a single photon energy $h\nu_{2-1}$, is reached. The important property of the BLED is therefore, variation of the emitted wavelength with the applied voltage.

The BLED's response time is controlled essentially by the electron energy relaxation in the nanotube, which can be in a pica-second range.

The disclosed planar technology for producing nanotube opto-electronic devices allows easy integration with the Si-based ICs, when the Si wafer is used as a substrate.

Finally, the semiconductor LED requires growth of lattice-matched heterostructure materials, which increases the device cost, while the disclosed devices comprise simple components, such as a glass substrate, and relies on relatively inexpensive processes of the nanotube growth and metal and ITO depositions.

Figure 5:
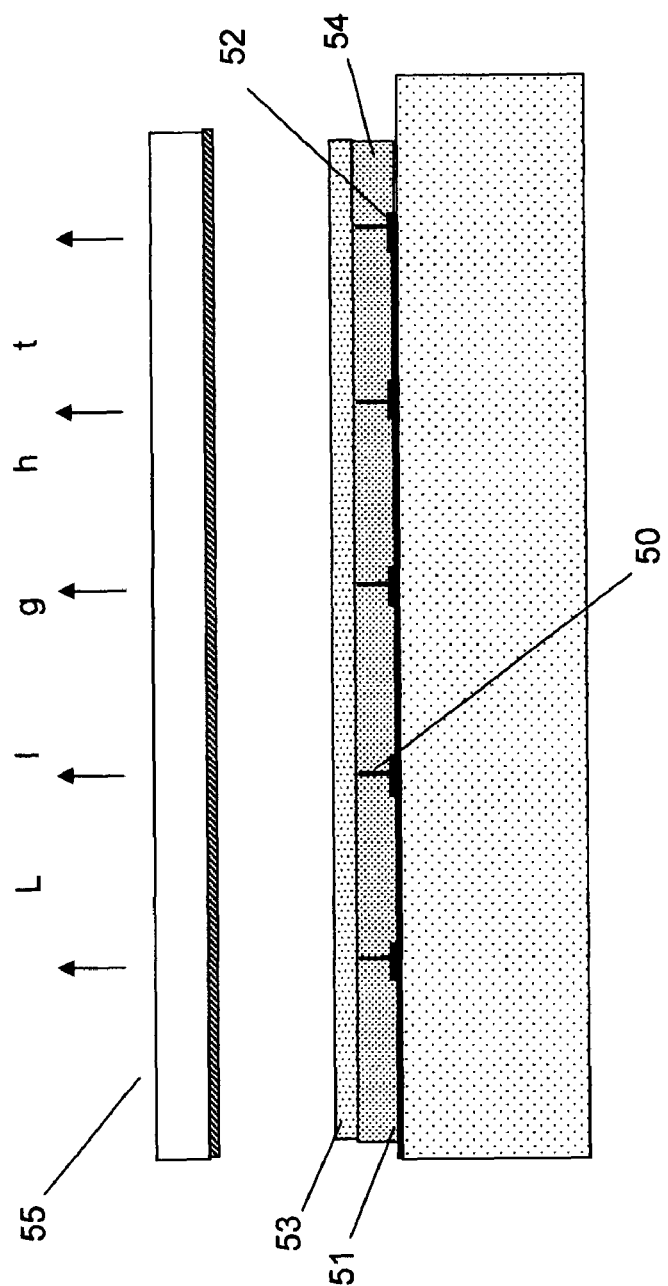
FIG. 5 shows the side view of the BLD.

The electron injection into high energy states in the nanotube and subsequent ballistic electron movement to the output contact, as shown in FIG. 4, indicate the presence of a strong electron population inversion between the resonant level 4 and lower levels, since, as discussed above, the electron tunneling into the lower levels is less efficient. This is a necessary condition for the laser activity. In this case, the nanotube matrix represents a media for developing of the optical gain. FIG. 5 illustrates the laser embodiment, wherein the nanotube matrix 50 embedded into the dielectric layer 54, with bottom continuous metal layer 51, the small Pd metal pads 52 and the top ITO layer 53 are similar to that of the BLED shown in FIG. 3. The bottom metal electrode serves also as a mirror with no optical transmission. The second, adjustable, mirror 55 is placed parallel to the substrate plane to form a laser cavity and provide a Fabry-Perot resonance, so that the whole construction represents a surface emitting laser. As in the BLED, the BLD employs electron relaxation between the quantum levels, and no electron-hole recombination takes place.

Although the optical gain length in the BLD, controlled by the thickness of $\sim 0.1$ µm of the insulator 54, is rather small, the device optical losses are also minimal: they are determined essentially by the light absorption in the ITO film and at the mirrors 51 and 55. No other losses, such as free carrier absorption, are expected: energy quantization in the nanotubes practically eliminates the light absorption by free electrons in the ground level. Besides, if necessary, the original concentration of electrons in the nanotubes can be reduced by doping with acceptors. To enhance the optical gain, the transmission of the top mirror should be minimized to increase the number of photon passages in the cavity. The main loss of the optical gain is expected to be due to variation of the nanotube parameters which affects the uniformity of the quantum level structure in the nanotube matrix.

As the BLED, the BLD is much less dependent of temperature than semiconductor lasers.

Unlike the semiconductor lasers, the BLD can be made on a Si wafer and used for signal transmission and processing in the integration circuits.

Thus, the disclosed invention provides unique technology for manufacturing of the nanotube-based ballistic opto-electronic devices, all of them having array of multiple and controllable number of the nanotubes. The utilized planar fabrication technique offers a method of mass production of high-speed photonic devices and a possibility of their integration with silicon-based IC components.

The invention claimed is:

1. The nanotube array ballistic light emitting diode, comprised of the following: components:
   dielectric substrate;
   first layer of metal with high optical reflectivity deposited on said substrate;
   array of small pads of metal having low resistive contact to the nanotube and deposited on said first layer of metal;
   array of carbon nanotubes grown normally to the substrate plane on said array of small pads of metal having low resistive contact to the nanotubes;
   dielectric film covering the nanotubes, said dielectric film being thinner than the height of the nanotubes, so that after deposition of said dielectric film the ends of said carbon nanotubes protrude beyond said dielectric film;
   second, optically transparent conductive electrode deposited on the exposed nanotube tips, said nanotube tips becoming exposed after preliminary polishing the surface of said dielectric film and thus removing protruded nanotube ends.

2. The nanotube array ballistic light emitting diode as in claim 1, wherein both the thickness of said dielectric film and the nanotube length are close to or less than 0.1 μm.

3. The nanotube array ballistic light emitting diode as in claim 1, wherein said second optically transparent conductive electrode is a layer of Indium Tin Oxide.

4. The nanotube array ballistic light emitting diode as in claim 1, wherein said first layer of metal is made from Al.

5. The nanotube array ballistic light emitting diode as in claim 1, wherein said array of small pads of metal having low resistive contact to the nanotubes is made from Pd.

6. The nanotube array ballistic laser diode, comprised of the following components:
   dielectric substrate;
   first layer of metal with high optical reflectivity deposited on said substrate;
   array of small pads of metal having low resistive contact to the nanotube and deposited on said first metal electrode;
   array of carbon nanotubes, grown normally to the substrate plane on said array of small pads of metal having low resistive contact to the nanotubes;
   dielectric film covering said carbon nanotubes, said dielectric film being thinner than the height of said carbon nanotubes, so that after deposition of said dielectric film the ends of said carbon nanotubes protrude beyond said dielectric film;
   second, optically transparent conductive electrode deposited on the exposed nanotube tips, said nanotube tips becoming exposed after preliminary polishing the surface of said dielectric film and thus removing protruded nanotube ends;
   position adjustable mirror, placed parallel to the substrate plane to form a Fabri-Perot resonator cavity.

7. The nanotube array ballistic laser diode as in claim 6, wherein both the thickness of said dielectric film and the nanotube length are close to or less than 0.1 μm.

8. The nanotube array ballistic laser diode as in claim 6, wherein said optically transparent conductive electrode is a layer of Indium Tin Oxide (ITO).

9. The nanotube array ballistic laser diode as in claim 6, wherein said first layer of metal is made from Al.

10. The nanotube array ballistic laser diode as in claim 6, wherein said array of small pads of metal having low resistive contact to the nanotubes is made from Pd.

* * * * *